(12) United States Patent
Garton et al.

(10) Patent No.: US 11,569,623 B2
(45) Date of Patent: Jan. 31, 2023

(54) BUSBAR CONNECTION WITH SIDE BAND COMMUNICATIONS

(71) Applicant: Microsoft Technology Licensing, LLC, Redmond, WA (US)

(72) Inventors: Chadd Nathaniel Garton, Woodinville, WA (US); Banha Sok, Kirkland, WA (US); Fredrick Anthony Constantino, Black Diamond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 145 days.

(21) Appl. No.: 16/987,873

(22) Filed: Aug. 7, 2020

(65) Prior Publication Data
US 2022/0045463 A1 Feb. 10, 2022

(51) Int. Cl.
*H05K 7/14* (2006.01)
*G06F 1/28* (2006.01)
*H01R 25/14* (2006.01)

(52) U.S. Cl.
CPC ............ *H01R 25/142* (2013.01); *G06F 1/28* (2013.01); *H01R 25/145* (2013.01); *H05K 7/1492* (2013.01)

(58) Field of Classification Search
CPC ....... H01R 25/142; H01R 25/145; G06F 1/28; H05K 7/1492
USPC .......................................................... 361/624
See application file for complete search history.

(56) References Cited

U.S. PATENT DOCUMENTS

| | | | | |
|---|---|---|---|---|
| 5,431,576 A | * | 7/1995 | Matthews | H01R 13/6315 439/247 |
| 6,317,312 B1 | * | 11/2001 | Hashizawa | H01H 9/10 337/194 |
| 6,327,140 B1 | * | 12/2001 | Hashizawa | H01H 9/085 337/194 |
| 6,333,845 B1 | * | 12/2001 | Hashizawa | H01H 9/10 337/194 |
| 2010/0190369 A1 | * | 7/2010 | Byrne | H01R 24/78 439/215 |
| 2012/0273252 A1 | * | 11/2012 | Benavides | H02G 5/005 29/832 |

(Continued)

FOREIGN PATENT DOCUMENTS

WO 2008132593 A2 11/2008

OTHER PUBLICATIONS

"International Search Report and Written Opinion Issued in PCT Application No. PCT/US21/030385", dated Aug. 3, 2021, 13 Pages.

*Primary Examiner* — Anatoly Vortman
(74) *Attorney, Agent, or Firm* — Ray Quinney & Nebeker P.C.; Paul N. Taylor

(57) ABSTRACT

A busbar connector includes an insulator body, a positive power delivery contact, a negative power delivery contact, and a side band contact. The insulator body has first prong and a second prong oriented in a longitudinal direction and proximate one another with a gap therebetween. The positive power delivery contact is on a first inner surface of the first prong adjacent the gap, and the negative power delivery contact is on a second inner surface of the second prong adjacent the gap. The side band contact is positioned on the insulator body and insulated from the positive power delivery contact and the negative power delivery contact by the insulator body.

17 Claims, 8 Drawing Sheets

(56) References Cited

U.S. PATENT DOCUMENTS

| | | | |
|---|---|---|---|
| 2013/0012072 A1* | 1/2013 | Costello | H01R 13/18 |
| | | | 439/786 |
| 2013/0303033 A1* | 11/2013 | Rong | H01R 13/113 |
| | | | 439/737 |
| 2016/0233602 A1* | 8/2016 | Chen | H01R 13/2492 |
| 2017/0164505 A1 | 6/2017 | Sarti | |
| 2019/0089093 A1 | 3/2019 | Liu et al. | |

* cited by examiner

BUSBAR CONNECTION WITH SIDE BAND COMMUNICATIONS

BACKGROUND

Background and Relevant Art

Racks for electronic devices, such as server racks with server blades, support and provide electrical connections for the electronic devices. The electrical connections provide power to the electronic devices. When electronic devices in the rack operate under high processing loads or other high-power consumption conditions, the electronic devices in the rack can draw electrical power from the power supply that can damage the power supply or power conduits. Throttling or power-capping the electronic devices on the rack can prevent an over-voltage or over-current situation on the rack.

BRIEF SUMMARY

In some embodiments, a busbar connector includes an insulator body, a positive power delivery contact, a negative power delivery contact, and a side band contact. The insulator body has a first prong and a second prong oriented in a longitudinal direction and proximate one another with a gap therebetween. The positive power delivery contact is on a first inner surface of the first prong adjacent the gap, and the negative power delivery contact is on a second inner surface of the second prong adjacent the gap. The side band contact is positioned on the insulator body and insulated from the positive power delivery contact and the negative power delivery contact by the insulator body.

In some embodiments, a system for providing electrical coupling includes a busbar connector and a busbar. The busbar connector includes an insulator body, a positive power delivery contact, a negative power delivery contact, and a side band contact. The insulator body has a first prong and a second prong oriented in a longitudinal direction and proximate one another with a gap therebetween. The positive power delivery contact is on a first inner surface of the first prong adjacent the gap, and the negative power delivery contact is on a second inner surface of the second prong adjacent the gap. The side band contact is positioned on the insulator body and insulated from the positive power delivery contact and the negative power delivery contact by the insulator body. The busbar includes a positive rail, a negative rail, an insulating material therebetween, and a side band source. The positive rail is oriented in a vertical direction perpendicular to the longitudinal direction, and the negative rail is oriented in the vertical direction parallel to the positive rail. The insulating material is positioned between the positive rail and the negative rail, wherein the positive rail, negative rail, and insulating material defines a busbar thickness in a transverse direction perpendicular to the vertical direction and the longitudinal direction and the busbar thickness is approximately the same as the gap between the first prong and the second prong. The side band source is oriented parallel to the positive rail and has at least one source contact.

In some embodiments, a method for providing data communication in a computing device rack system includes, at a rack manager, detecting a presence of a server blade via a side band contact electrically coupled to a side band source of a busbar of the computing device rack system, receiving instructions from a networked electronic device, and transmitting a side band signal to the server blade through the side band source This Summary is provided to introduce a selection of concepts in a simplified form that are further described below in the Detailed Description. This Summary is not intended to identify key features or essential features of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 is a top view of a DC busbar, according to at least some embodiments of the present disclosure;

FIG. 3-2 is a perspective view of the DC busbar of FIG. 3-1;

DETAILED DESCRIPTION

The present disclosure relates generally to systems and methods for a connection for transmitting electrical signals. More particularly, the present disclosure relates to systems and methods of providing a data communication on a side band for computing devices in a rack system through a direct current (DC) busbar connector. Busbar connections according to the present disclosure may include one or more busbar connectors.

Data centers use racks to hold a plurality of and variety of computing devices in a relatively compact environment. A conventional rack system, such as a server rack, includes a power distribution unit (PDU) to provide electrical power to a plurality of electronic or computing devices connected to the PDU. In some embodiments, a PDU can provide dozens of kilowatts (kW) of electrical power, with some examples providing 17 kW or 34 kW or more. A conventional PDU includes a plurality of connectors that each include a plurality of receiving contacts that allow electrical connection to the connected devices.

Figure 1:
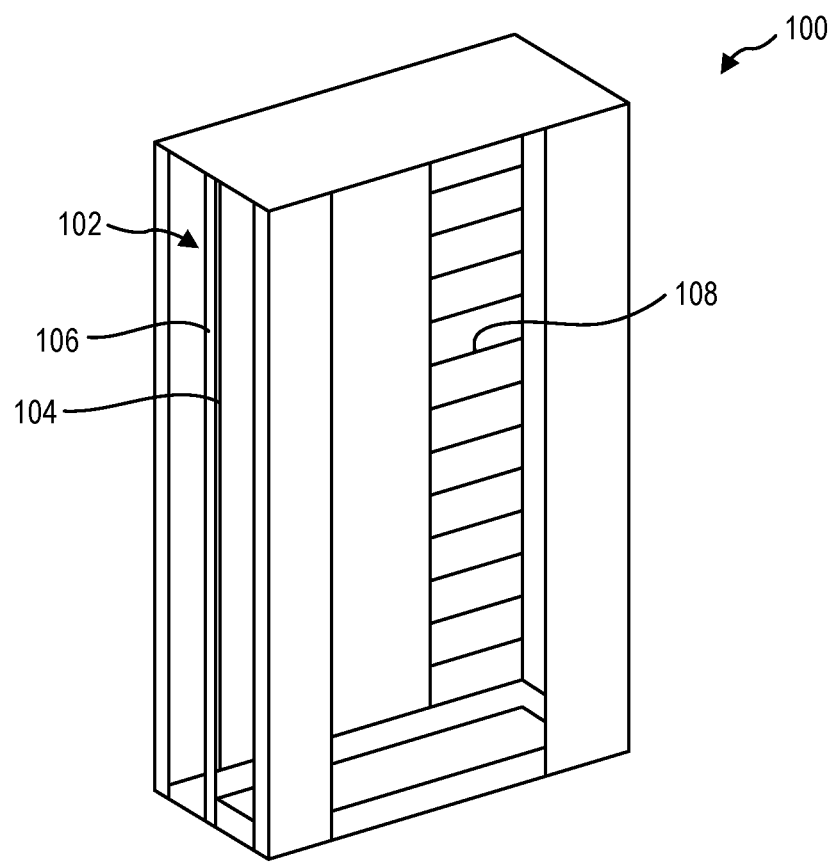
FIG. 1 is a rear perspective view of a rack including a direct current (DC) busbar, according to at least some embodiments of the present disclosure.

Referring now to FIG. 1, a rack system 100 including a DC busbar 102 provides DC electrical power to electronic devices connected to the busbar 102. FIG. 1 is a rear perspective view of the rack system 100. In some embodiments, the busbar 102 has discrete connection points at which the electronic devices can be connected to the busbar. In some embodiments, the busbar 102 is a continuous and substantially uniform busbar to which the electronic devices connect at any location along the length thereof. For example, the busbar can include a positive rail 104 and a negative rail 106 that are parallel and continuous along the vertical length of the busbar 102. At any location along the length of the busbar 102, an electronic device having a suitable busbar connector can contact the positive rail 104 and the negative rail 106 to provide DC electrical power to the electronic device.

An electronic device may be a blade of a server rack. In some examples, the electronic device can be another computing device or component of a computing device that is connected to a PDU, such as is used in a server rack. The electronic device has a male busbar connector that includes both power delivery contacts. The power delivery contacts include a positive power delivery contact, which contacts the positive rail of the busbar, and a negative power delivery contact, which contacts the negative rail of the busbar.

In some embodiments, a continuous and uniform busbar 102 for power delivery lacks a mechanism for data communication with the electronic device. A busbar according to the present disclosure includes a side band that contacts a side band contact of the busbar connector of the electronic device to provide an integrated and discrete communication channel with the electronic device. An integrated side band contact in the busbar connector can allow the electronic device to communicate with a power delivery unit (PDU), power supply unit (PSU), power delivery and management unit (PDMU), Power Shelf, or other rack manager.

In some embodiments, a server rack, storage rack, PSU rack, or other rack of electronic devices includes a PDU mounted in the rack system 100. The power delivery in the busbar 102 may be controlled by a PDMU, such as a Power Shelf device. A Power Shelf device is a device connected to the rack that manages and distributes power to the busbar.

The Power Shelf can receive data communications from a row manager or other networked computing device that provides instructions to the Power Shelf. The Power Shelf can subsequently manage power delivery to the electronic devices connected to the busbar 102 based upon the instructions from the row manager or other networked device. In some instances, the Power Shelf can receive information from the electronic devices and manage power delivery to the electronic devices connected to the busbar 102 based upon the information received from the electronic devices.

In some embodiments, the busbar 102 provides electrical power to the electronic devices. In some embodiments, the busbar 102 provides at least 100 A of DC electrical current to an electrical device. In some embodiments, the busbar 102 provides at least 200 A of electrical current to an electrical device. In some embodiments, the busbar 102 provides at least 300 A of electrical current to an electrical device. In some embodiments, the busbar 102 can carry 1000 A across the busbar 102. In some embodiments, the busbar 102 provides at least 48 V in the DC current across the busbar.

Because the busbar 102 provides electrical current and voltage to the electronic devices in parallel, the delivery of the electrical current and voltage is uniform to each of the electronic devices. For example, communication to individual electronic devices is not possible on the busbar, while modulation of the voltage and/or current to communicate with the electronic device affects all of the electronic devices.

In some embodiments, the busbar 102 is positioned in a rear of the rack system 100. The rack system 100 may include a plurality of supports 108 by which electronic devices are retained by the rack system 100. When an electronic device is positioned in the rack system 100, the electronic device is pushed to the rear of the rack system 100 such that a busbar connector of the electronic device mates with the busbar 102 in the rack system 100. In embodiments with a Power Shelf, a PDU, or a power supply in communication with the busbar 102, the busbar 102 is energized and capable of delivering power to the electronic devices.

Figure 2:
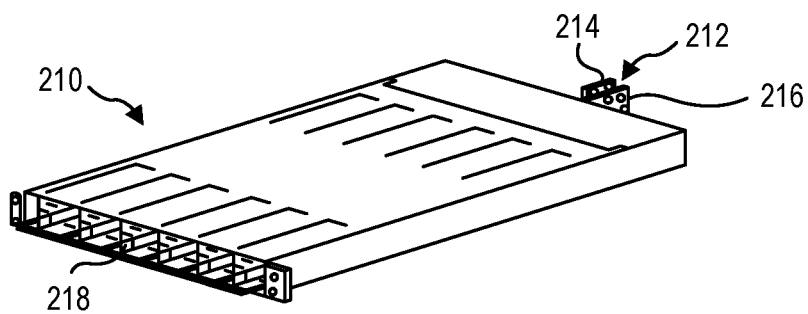
FIG. 2 is a perspective view of a power management unit (PMU) with a busbar connector, according to at least some embodiments of the present disclosure.

FIG. 2 is a perspective view of a Power Shelf 210. In some embodiments, a Power Shelf 210 includes a busbar connector 212 on a rear surface thereof. The busbar connector 212, according to the present disclosure, includes at least a positive power delivery contact 214 and a negative power delivery contact 216. The positive power delivery contact 214 and negative power delivery contact 216 are positioned away from one another and configured to contact the positive rail and negative rail of the busbar, respectively. A side band contact of the busbar connector is insulated from the positive power delivery contact 214 and the negative power delivery contact 216 to ensure data communication on the side band does not receive electromagnetic interference (EMI) from the positive power delivery contact 214 and the negative power delivery contact 216. Various embodiments of a side band contact are described further in relation to FIG. 5 through FIG. 8.

In some embodiments, the Power Shelf 210 includes a plurality of data and/or power connections 218 to provide communications and power to the Power Shelf 210. The power connections 218 may allow the Power Shelf 210 to be in data communication with a row manager or with other networked devices to receive power management instructions. The power management instructions may instruct the Power Shelf 210 to change the electrical current and/or voltage provided to the busbar. In some embodiments, the power management instructions instruct the Power Shelf 210 to communicate with one or more electronic devices connected to the busbar and change at least one operating parameter of the electronic device.

Figure 3:
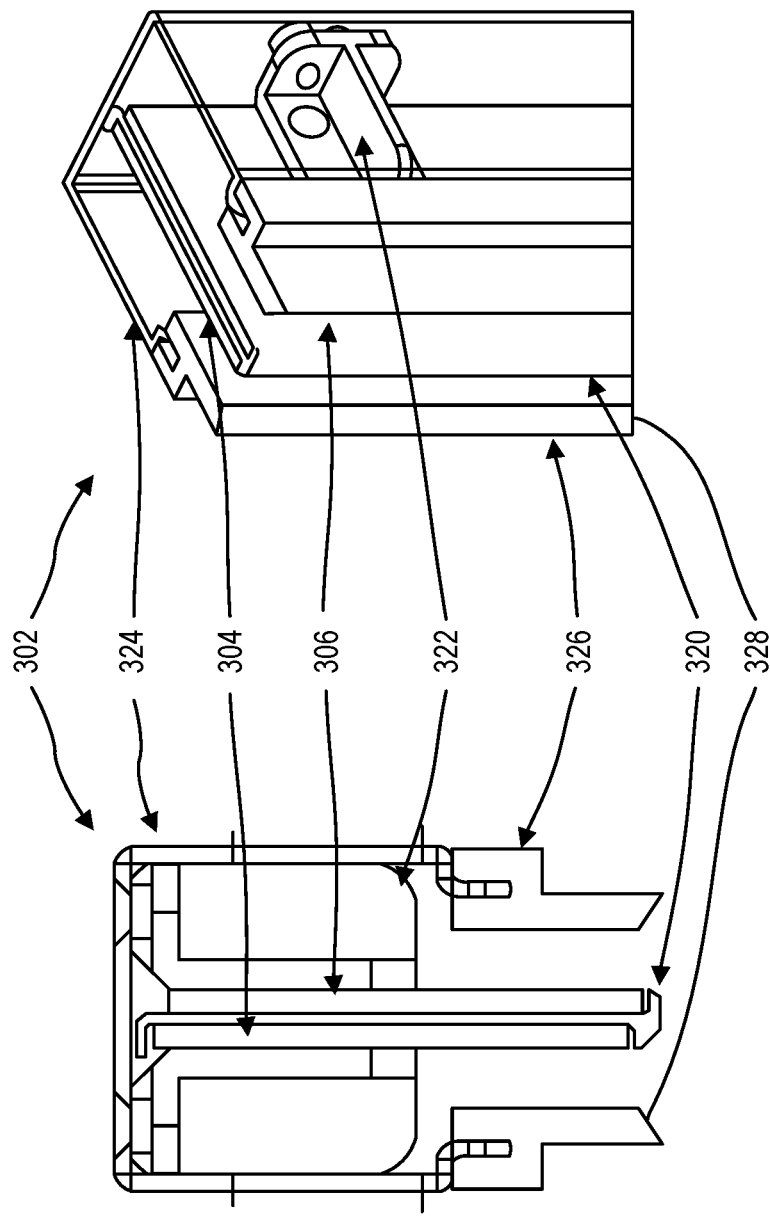

FIG. 3-1 and FIG. 3-2 illustrate a top cross-sectional view and a perspective view of a conventional DC busbar 302. In some embodiments, the busbar 302 includes a positive rail 304 and a negative (or return) rail 306. The positive rail 304 and negative rail 306 are parallel and continuous along the vertical length of the busbar 302. The busbar 302 can, therefore, receive a complementary busbar connector of an electronic device at any location along the vertical length of the busbar 302. The positive rail 304 and negative rail 306 are separated by and insulated from one another by an insulator spacer 320 positioned between the parallel positive rail 304 and negative rail 306.

The positive rail 304 and negative rail 306 of the busbar 302 are supported opposite the insulator spacer 320 and on opposing sides of the busbar 302 by insulator supports 322. The insulator spacer 320 and insulator supports 322 insulate the positive rail 304 and negative rail 306 from the metal housing 324 of the busbar 302.

To ease mating of the busbar with an associated busbar connector, in some embodiments, the busbar 302 includes one or more guide members 326 positioned proximate and parallel to the positive rail 304 and negative rail 306. In some embodiments, a pair of guide members 326 flank the positive rail 304 and negative rail 306 on opposite sides to guide the busbar connector onto the busbar 302.

Figure 4:
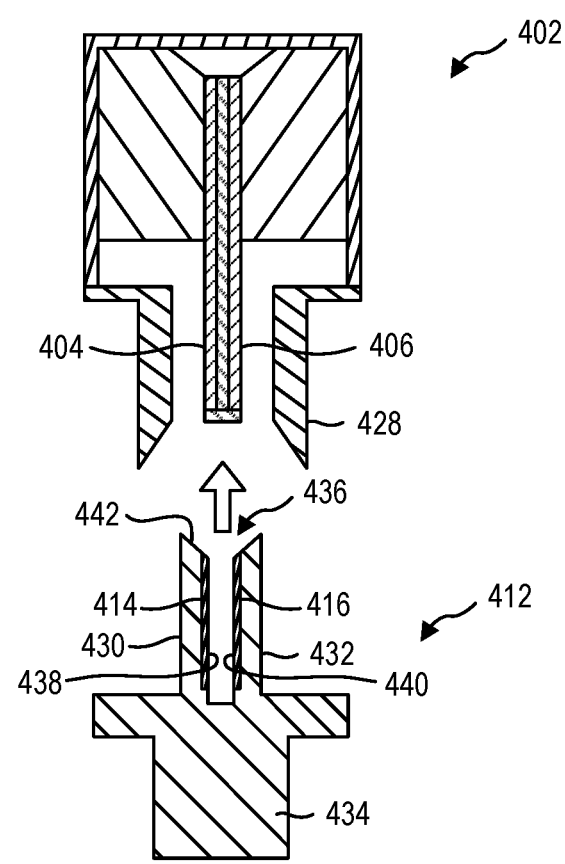
FIG. 4 is a top cross-sectional view of a DC busbar connection, according to at least some embodiments of the present disclosure.

The guide members 326 may include one or more features that facilitate guiding the busbar connector onto the busbar 302. For example, the guide members 326 may include a compliant or resilient material that elastically deforms and cushions rattling of the busbar connector during mating of the connection. In some examples, the guide members 326 include beveled, slanted, or otherwise angled tips 328 to urge a laterally misaligned busbar connector onto the busbar 302 as the busbar connector is moved toward the busbar 302. FIG. 4 is a top cross-sectional view of an embodiment of a busbar 402, similar to that described in relation to FIG. 3, mating with a busbar connector 412 of an electronic device.

In some embodiments, the busbar connector 412 includes a first prong 430 and a second prong 432 that protrude from an insulator body 434. The first prong and second prong are oriented in a longitudinal direction. The first prong 430 and second prong 432 are proximate one another with a gap 436 therebetween. In some embodiments, the first prong 430 and second prong 432 are parallel to one another with inner surfaces 438, 440 thereof oriented across the gap 436 from one another.

The busbar connector 412 has a positive power delivery contact 414 and a negative power delivery contact 416 oriented opposite one another across the gap 436. When pushed toward the busbar 402, the busbar connector 412 mates with the busbar 402 to position the first prong 430 and second prong 432 on opposite sides of the busbar 402. The positive rail 404 and negative rail 406 (and insulator spacer therebetween) define a busbar thickness. In some embodiments, the busbar thickness is substantially the same as the gap 436 of the busbar connector 412. When connected to the busbar 402, the positive power delivery contact 414 and negative power delivery contact 416 each contact the positive rail 404 and negative rail 406 of the busbar 402, respectively, to create an electrical connection.

In some embodiments, the first prong 430 and/or second prong 432 have beveled, slanted, or otherwise angled tips 442 relative to the longitudinal direction. The angled tips 442 may interact with the angled tips of the guide members 428 of the busbar 402 to guide the first prong 430 and/or second prong 432 of the busbar connector 412 into contact with the busbar 402. In some embodiments, the busbar thickness is greater than the gap 436 of the busbar connector 412. In some embodiments, the elastic deformation of the guide members 428 outward by the insertion of the busbar connector 412 results in a compressive force on the first prong 430 and second prong 432 to urge the positive power delivery contact 414 and negative power delivery contact 416 into contact with the positive rail 404 and negative rail 406, respectively, of the busbar 402.

In some embodiments, a connection of the busbar connector with a busbar also connects the side band circuit. For example, the side band circuit is completed upon connection of a side band contact of the busbar connector and the side band source of the busbar. In some embodiments, the side band contact is positioned on the insulator body of the busbar connector and is insulated from the positive power delivery contact and negative power delivery contact by the insulator body. The side band source of the busbar is parallel to the positive rail and/or negative rail, and the side band source allows a signal from the Power Shelf or other rack manager to be transmitted to the electronic device(s).

Figure 5:
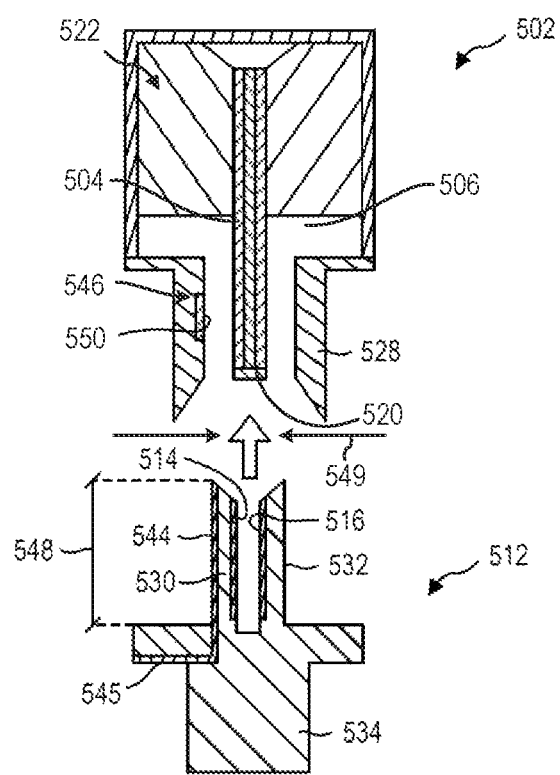
FIG. 5 is a top cross-sectional view of a DC busbar connection with a side band, according to at least some embodiments of the present disclosure.

Referring now to FIG. 5, a busbar 502 is shown with a positive rail 504 and a negative rail 506. The positive rail 504 and the negative rail 506 are separated by and insulated from one another by an insulator spacer 520. The positive rail 504 and negative rail 506 of the busbar 502 are supported on opposite side of the insulator spacer 520 and on opposing sides of the busbar 502 by one or more insulator supports 522. The insulator spacer 520 and one or more insulator supports 522 insulate the positive rail 504 and negative rail 506 from the metal housing 524 of the busbar 502. In some embodiments, the side band signal is provided through a side wipe in the connection. For example, the side band contact 544 in the busbar connector 512 is a side wipe on the outer surface of the first prong 530 or second prong 532 opposite the positive power delivery contact 514 and negative power delivery contact 516 and insulated by the insulator body 534 by at least 1 millimeter of the insulator body 534. The side band source 546, similarly, is located in or on an inner surface of a guide member 528 of the busbar 502. The side band source 546 is shown with a single side band source contact 550. A side band contact 544 that is a side wipe may, in some embodiments, have a longitudinal length 548 (e.g., in a longitudinal direction shown by the arrow pointing to the top of the page which is perpendicular to a vertical direction extending out of the page) that is the entire length of the prong(s) 530, 532 of the busbar connector 512. The busbar 502 includes a busbar width 549. A side band contact 544 that is a side wipe may, in some embodiments, have a longitudinal length 548 that is at least half of the entire length of the prong(s) 530, 532 of the busbar connector 512. A side wipe that covers a majority or the entire length of the prong 530, 532 of the busbar connector 512 may provide a reliable connection even when the busbar connector 512 is inserted less than fully into the busbar 502. The side band contact 544 may be electrically coupled to a side band return 545 that projects laterally from the insulator body 534 to provide electrical coupling to the electronic device (i.e., connection to a printed circuit board).

Figure 6:
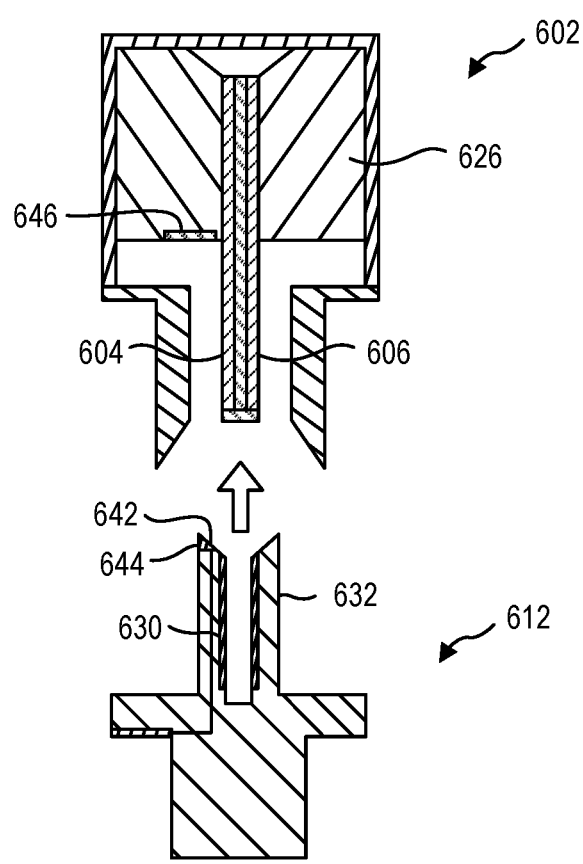
FIG. 6 is a top cross-sectional view of another DC busbar connection with a side band, according to at least some embodiments of the present disclosure.

Another embodiment of a busbar and busbar connection with a side channel is shown in the top cross-section view of FIG. 6. A side band contact 644 that is located on a tip 642 of a prong 630, 632 may function as a confirmation mechanism that the busbar connector 612 is fully inserted onto the busbar 602. In some embodiments, the side band contact 644 is positioned at a tip 642 of the first prong 630 or second prong 632, and a side band source 646 is positioned on the insulator support 626 of the busbar 602. In some embodiments, at least a portion of the insulator support 626 is located between the positive rail 604 and/or negative rail 606 of the busbar and the side band source 646 to insulate the side band source 646 from EMI.

Figure 7:
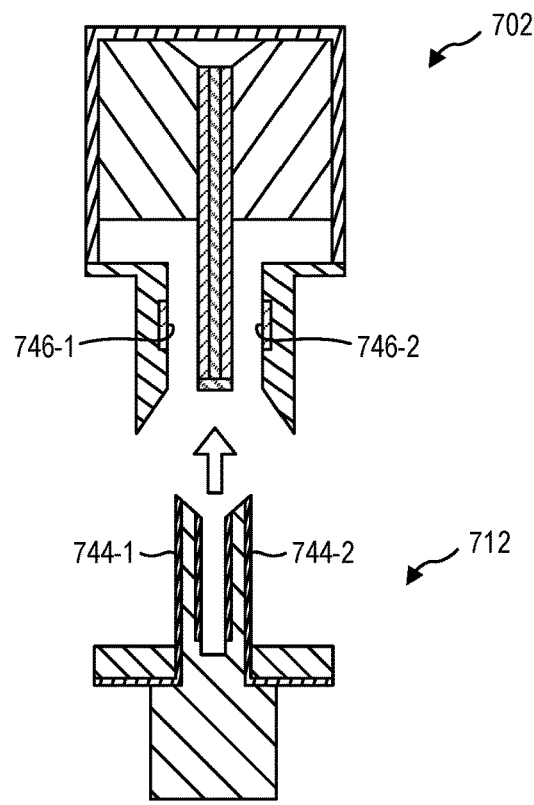
FIG. 7 is a top cross-sectional view of a DC busbar connection with a plurality of side bands, according to at least some embodiments of the present disclosure.

In some embodiments, the busbar connector 712 includes a plurality of side band contacts 744-1, 744-2, and the busbar 702 includes a plurality of complementary side band sources 746-1, 746-2, as illustrated in FIG. 7. For example, the busbar connector may include a first side band contact on an outer surface of the first prong and a second side band contact on an outer surface of the second prong. In some embodiments, the first side band contact is a tip contact located at the tip of the first prong and the second side band contact is a tip contact located at the tip of the second prong. In some embodiments, the first side band contact is a tip contact located at the tip of the first prong and the second side band contact is a side wipe on the outer surface of the second prong. In some embodiments, the first side band contact is a tip contact located at the tip of the first prong and the second side band contact is a side wipe contact on the outer surface of the first prong. The busbar connector may include a plurality of side band contacts located in different longitudinal positions on the tip and/or side of the first prong and/or second prong.

Figure 8:
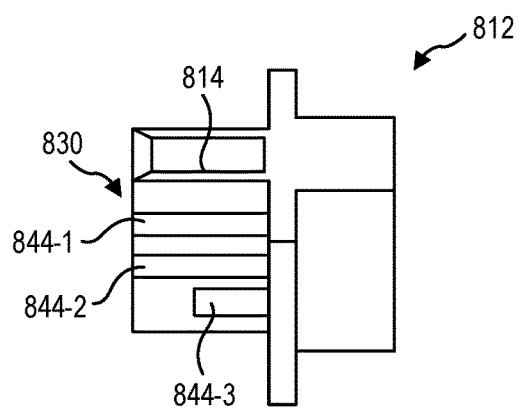
FIG. 8 is a perspective view of a DC busbar connector with a plurality of side bands, according to at least some embodiments of the present disclosure.

In embodiments with a first side band contact and a second side band contact on a prong, the plurality of side band contacts may be located in different vertical positions. FIG. 8 is a side perspective view of an embodiment of a busbar connector 812 wherein a first side band contact 844-1 is a side wipe contact located on the outer surface of the first prong 830 at a first vertical position, and a second side band contact 844-2 is a side wipe contact located on the outer surface of the first prong 830 at a second vertical position. In some embodiments, the first side band contact 844-1 is a side wipe contact located on the outer surface of the first prong 830 at a first vertical position, and another side band contact (e.g., third side band contact 844-3) is a side wipe contact located on the outer surface of the first prong 830 at a second vertical position and a second longitudinal position (e.g., the third side band contact 844-3 is shorter in the longitudinal direction than the first side band contact 844-2) to allow the contact of different side band sources.

In some embodiments, the positive (or negative) power delivery contact 814 has a positive power delivery contact height in a vertical direction perpendicular to the longitudinal direction of the first prong 830, and at least one side band contact 844-1, 844-2, 844-3 has a side band contact height that is less than the positive power delivery contact height. In some embodiments, the side band contact 844-1, 844-2, 844-3 has a height in the vertical direction that is the same or greater than that of the positive power delivery contact 814.

Figure 9:
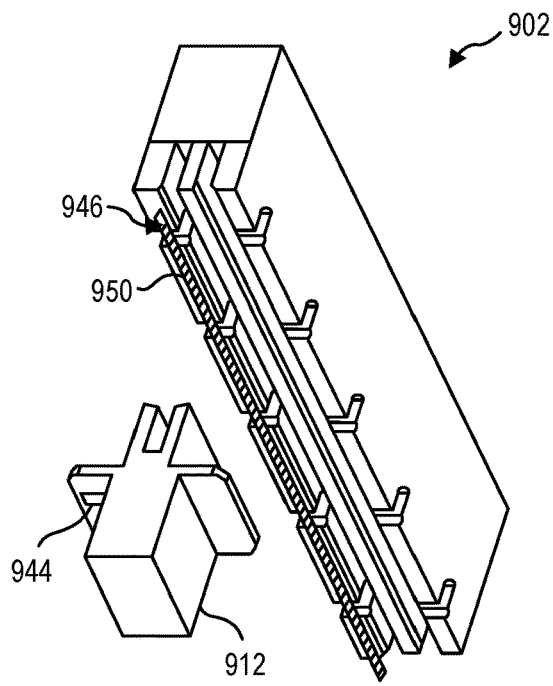
FIG. 9 is a perspective exploded view of a DC busbar connector with a side band having a plurality of contacts, according to at least some embodiments of the present disclosure.

A side band source may be a continuous rail supported by the housing and/or insulator supports of the busbar. A continuous rail side band source may allow for a side band signal to be transmitted simultaneously to any electronic devices with a busbar connector in contact and/or communication with the continuous rail side band source. In some embodiments, a busbar has a plurality of parallel side band sources that are located at different positions, such as different longitudinal positions. FIG. 9 is a perspective view of a busbar 902 with a side band source 946 that includes a plurality of side band source contacts 950. A first side band contact 944 of a busbar connector 912 may contact only a first side band source contact 950 at the first position while a second side band contact of the busbar connector may contact a second side band source at a second position. In some embodiments, a side band contact 944 of the busbar connector 912 contacts a plurality of side band source contacts 950 of the busbar 902. In some embodiments, each side band contact 944 of the busbar connector 912 contacts only one of the side band source contacts 950 of the busbar.

Different side band connections between busbar and the busbar connector may allow for the communication of different side band signals. For example, a conventional PDU in a rack system includes a plurality of signal pins that may be used to communicate different instructions to electronic devices. In some embodiments according to the present disclosure, the side band signals may include any of power capping instructions; electronic device enabling or disabling instructions; information, identification, or status requests; electronic device sleep mode instructions; or other communication signals between the rack manager (e.g., Power Shelf) and the electronic devices connected to the busbar.

In some embodiments, the side band source is a series of discrete contacts. The series of discrete contacts allows for positional information or device identification of the connected busbar connector (and associated electronic device). For example, when a plurality of electronic devices is connected to the busbar, the Power Shelf may identify an electronic device based on the side band source contact with which the busbar connector of the electronic device is in contact. The Power Shelf may, therefore, be able to send communication individually to different electronic devices through the series of side band sources, as opposed to a single signal provided to all connected devices through a continuous rail side band source.

Figure 10:
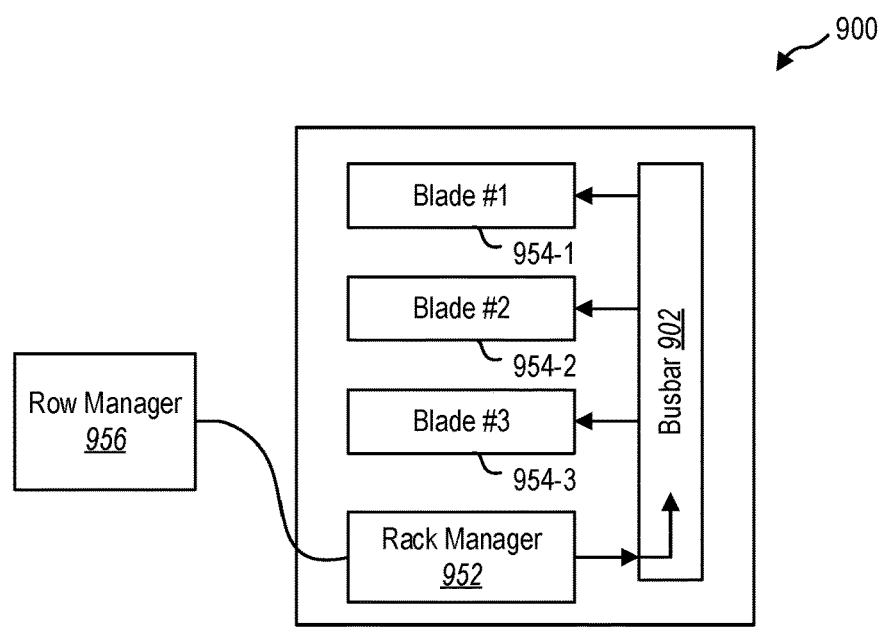
FIG. 10 is a schematic representation of global side band communication within a rack system, according to at least some embodiments of the present disclosure.
Figure 11:
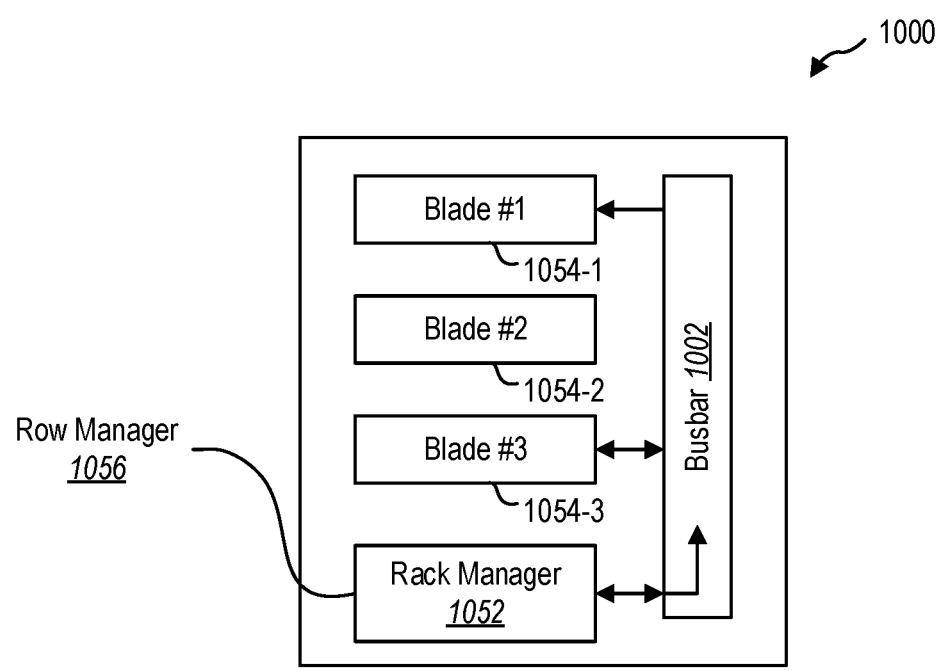
FIG. 11 is a schematic representation of individual side band communication within a rack system, according to at least some embodiments of the present disclosure.

FIG. 10 and FIG. 11 schematically illustrate communication methods via a DC busbar including a side band source. A rack system 900 includes, in some embodiments, a rack manager 952 (such as a Power Shelf) connected to the busbar 902, with one or more electronic devices 954-1, 954-2, 954-3 (such as server blades) connected to the busbar 902. The rack manager 952 may be in data communication with a row manager 956 that provides instructions, such as power capping instructions, to the rack manager 952. In some embodiments, the rack manager 952 transmits a power capping instruction to the side band source through a side band contact of the rack manager's busbar connector.

The side band signal provided to the side band source of the busbar 902 is then received by any electronic devices 954-1, 954-2, 954-3 connected to the side band source through the busbar connectors of the respective electronic devices 954-1, 954-2, 954-3. In some embodiments, the side band source is a continuous rail connected to a plurality of busbar connectors. In some embodiments, the side band source includes a plurality of discrete contacts, and the rack manager 952 provides the side band signal to the plurality of discrete contacts.

In some embodiments, the side band signal is provided on the side band source with an voltage of less than 48V. In some embodiments, the side band signal is provided on the side band source with an voltage of less than 12V. In some embodiments, the side band signal is provided on the side band source with an voltage of less than 5V.

In some embodiments, the side band signal is provided on the side band source with an electrical current of less than 10 milliamperes (mA). In some embodiments, the side band signal is provided on the side band source with an electrical current of less than 5 milliamperes (mA). In some embodiments, the side band signal is provided on the side band source with an electrical current of less than 3 milliamperes (mA).

Referring now to FIG. 11, a rack system 1000 according to the present disclosure may provide instructions to individual electronic devices 1054-1, 1054-2, 1054-3 connected to a DC busbar 1002 via side band signals. In some embodiments, a rack manager 1052 receives instruction from a row manager 1056, and the rack manager 1052 communicates with a side band source of the busbar 1002. The side band source of the busbar 1002 can transmit the instruction to the electronic devices 1054-1, 1054-2, 1054-3 connected to the busbar 1002. In some embodiments, the rack manager 1052 sends instructions to electronic devices 1054-1, 054-3 individually, such that at least one of the electronic devices (e.g., 1054-2) does not receive the instructions. In some embodiments, the busbar 1002 has a plurality of side band contacts that allow individual communication with the electronic devices 1054-1, 1054-2, 1054-3. In some embodiments, the side band source is a continuous rail that provide the side band signal to the plurality of electronic devices 1054-1, 1054-2, 1054-3, and the side band signal includes instructions that communicate with individual electronic devices 1054-1, 1054-2, 1054-3 based on device identification.

In at least one embodiment, an electronic device 1054-3 provides a side band signal through the side band contact of the busbar connector to the side band source of the busbar 1002. Through the side band source, the side band signal is transmitted to the rack manager 1052, allowing two-way communication between the electronic device(s) 1054-3 and the rack manager 1502.

INDUSTRIAL APPLICABILITY

The present disclosure relates generally to systems and methods for a connection for transmitting electrical signals. More particularly, the present disclosure relates to systems and methods of providing a data communication on a side band for computing devices in a rack system through a busbar connector. Busbar connections according to the present disclosure may include one or more busbar connectors.

Data centers use racks to hold a plurality of and variety of computing devices in a relatively compact environment. A conventional rack system, such as a server rack, includes a power distribution unit (PDU) to provide electrical power to a plurality of electronic or computing devices connected to the PDU. In some embodiments, a PDU can provide dozens of kilowatts (kW) of electrical power, with some examples providing 17 kW or 34 kW. A conventional PDU includes a plurality of connectors that each include a plurality of receiving contacts that allow electrical connection to the connected devices.

A rack system including a busbar connector provides electrical power to electronic devices connected to the busbar. In some embodiments, the busbar has discrete connection points at which the electronic devices can be connected to the busbar. In some embodiments, the busbar is a continuous busbar and substantially uniform busbar to which the electronic devices connect at any location along the length thereof. For example, the busbar can include a positive rail and a negative rail that are parallel and continuous along the length of the busbar. At any location along the length of the busbar, an electronic device having a suitable busbar connector can contact the positive rail and the negative rail to provide power to the electronic device.

An electronic device may be a blade of a server rack. In some examples, the electronic device can be another computing device or component of a computing device that is connected to a PDU, such as used in a server rack. The electronic device has a male busbar connector that includes both power delivery contacts. The power delivery contacts include a positive power delivery contact, which contacts the positive rail of the busbar, and a negative power delivery contact, which contacts the negative rail of the busbar.

In some embodiments, a continuous and uniform busbar for power delivery lacks a mechanism for data communication with the electronic device. A busbar according to the present disclosure includes a side band that contacts a side band contact of the busbar connector of the electronic device to provide an integrated and discrete communication channel with the electronic device. An integrated side band contact in the busbar connector can allow the electronic device to communicate with a power delivery unit (PDU), power supply unit (PSU), power delivery and management unit (PDMU), Power Shelf, or other rack manager.

In some embodiments, a server rack, storage rack, PSU rack, or other rack of electronic devices includes a PDU mounted in the rack. The power delivery in the busbar may be controlled by a PDMU, such as a Power Shelf device. A Power Shelf device is device connected to the rack that manages and distributes power to the busbar. The Power Shelf can receive data communications from a row manager or other networked computing device that provides instructions to the Power Shelf. The Power Shelf can subsequently manage power delivery to the electronic devices connected to the busbar based upon the instructions from the row manager or other networked device. In some instances, the Power Shelf can receive information from the electronic devices and manage power delivery to the electronic devices connected to the busbar based upon the information received from the electronic devices.

In some embodiments, the busbar provides electrical power to the electronic devices. In some embodiments, the busbar provides at least 10 A of electrical current in a DC current to an electrical device. In some embodiments, the busbar provides at least 200 A of electrical current to an electrical device. In some embodiments, the busbar provides at least 300 A of electrical current to an electrical device. In some embodiments, the busbar carries at least 1000 A on the busbar from a Power Shelf. In some embodiments, the busbar provides at least 48 V of voltage in the DC current across the busbar.

Because the busbar provides electrical current and voltage to the electronic devices in parallel, the delivery of the electrical current and voltage is uniform to each of the electronic devices. For example, communication to individual electronic devices is not possible on the busbar, while modulation of the voltage and/or current to communicate with the electronic device affects all of the electronic devices.

In some embodiments, the busbar is positioned in a rear of the rack. The rack may include a plurality of supports by which electronic devices are retained by the rack. When an electronic device is positioned in the rack, the electronic device is pushed to the rear of the rack such that a busbar connector of the electronic device mates with the busbar in the rack. In embodiments with a Power Shelf, a PDU, or a power supply in communication with the busbar, the busbar is energized and capable of delivering power to the electronic devices.

In some embodiments, a Power Shelf includes a busbar connector on a rear surface, thereof. The busbar connector, according to the present disclosure, includes at least a positive power delivery contact and a negative power delivery contact. The positive power delivery contact and negative power delivery contact are positioned away from one another and configured to contact the positive rail and negative rail of the busbar, respectively. A side band contact of the busbar connector is insulated from the positive power delivery contact and a negative power delivery contact to ensure data communication on the side band does not receive electromagnetic interference (EMI) from the positive power delivery contact and a negative power delivery contact.

In some embodiments, the Power Shelf includes a plurality of data and/or power connections to provide communications and power to the Power Shelf. The data connections may allow the Power Shelf to be in data communication with a row manager or with other networked devices to receive power management instructions. The power management instructions may instruct the Power Shelf to change the electrical current and/or voltage provided to the busbar. In some embodiments, the power management instructions instruct the Power Shelf to communicate with one or more electronic devices connected to the busbar and change at least one operating parameter of the electronic device.

In some embodiments, the busbar includes a positive rail and a negative (or return) rail. The positive rail and negative rail are parallel and continuous along the length of the busbar. The busbar can, therefore, receive a complementary busbar connector at any location along the length of the busbar. The positive rail and negative rail are separated by and insulated from one another by an insulator spacer positioned between the parallel positive rail and negative rail.

The positive rail and negative rail of the busbar are supported opposite the insulator spacer and on opposing sides of the busbar by insulator supports. The insulator spacer insulates the positive rail and negative rail from the metal housing of the busbar.

To ease mating of the busbar with an associated busbar connector, in some embodiments, the busbar includes one or more guide members positioned proximate and parallel to the positive rail and negative rail. In some embodiments, a pair of guide members flank the positive rail and negative rail on opposite sides to guide the busbar connector onto the busbar.

The guide members may include one or more features that facilitate guiding the busbar connector onto the busbar. For example, the guide members may include a compliant or resilient material that elastically deforms and cushions rattling of the busbar connector during mating of the connection. In some examples, the guide members include beveled, slanted, or otherwise angled tips to urge a laterally misaligned busbar connector onto the busbar as the busbar connector is moved toward the busbar.

In some embodiments, the busbar connector includes a first prong and a second prong that protrude from an insulator body. The first prong and second prong are oriented in a longitudinal direction. The first prong and second prong are proximate one another with a gap therebetween. In some embodiments, the first prong and second prong are parallel to one another with inner surfaces thereof oriented across the gap from one another.

The busbar connector has a positive power delivery contact and a negative power delivery contact oriented opposite one another across the gap. When pushed toward the busbar, the busbar connector mates with the busbar to position the first prong and second prong on opposite sides of the busbar. When connected to the busbar, the positive power delivery contact and negative power delivery contact each contact the positive rail and negative rail of the busbar, respectively, to create an electrical connection.

In some embodiments, the first prong and/or second prong have beveled, slanted, or otherwise angled tips relative to the longitudinal direction. The angled tips may interact with the angled tips of the guide members of the busbar to guide the first prong and/or second prong of the busbar connector into contact with the busbar. In some embodiments, the elastic deformation of the guide members outward by the insertion of the busbar connector results in a compressive force on the first prong and second prong to urge the positive power delivery contact and negative power delivery contact into contact with the positive rail and negative rail, respectively, of the busbar.

In some embodiments, a connection of the busbar connector and busbar connects a side band circuit through a side band contact of the busbar connector and the side band source of the busbar. In some embodiments, the side band contact is positioned on the insulator body of the busbar connector and is insulated from the positive power delivery contact and negative power delivery contact by the insulator body. The side band source of the busbar is parallel to the positive rail and/or negative rail, and the side band source allows a signal from the Power Shelf or other rack manager to be transmitted to the electronic device(s).

In some embodiments, the side band signal is provided through a side wipe in the connection. For example, the side band contact in the busbar connector is a side wipe on the outer surface of the first prong or second prong opposite the positive power delivery contact and negative power delivery contact and insulated by the insulator body. The side band source, similarly, is located in or on an inner surface of a guide member of the busbar. A side band contact that is a side wipe may, in some embodiments, have a longitudinal length that is the entire length of the prong(s) of the busbar connector. A side band contact that is a side wipe may, in some embodiments, have a longitudinal length that is at least half of the entire length of the prong(s) of the busbar connector. A side wipe that covers a majority or the entire length of the prong of the busbar connector may provide a reliable connection even when the busbar connector is inserted less than fully into the busbar.

A side band contact that is located on a tip of a prong may function as a confirmation mechanism that the busbar connector is fully inserted onto the busbar. In some embodiments, the side band contact is positioned at a tip of the first prong or second prong, and a side band source is positioned on the insulator support of the busbar. In some embodiments, at least a portion of the insulator support is located between the positive rail and/or negative rail of the busbar and the side band source to insulate the side band source from EMI.

In some embodiments, the busbar connector includes a plurality of side band contacts, and the busbar includes a plurality of complementary side band sources. For example, the busbar connector may include a first side band contact on an outer surface of the first prong and a second side band contact on an outer surface of the second prong. In some embodiments, the first side band contact is a tip contact located at the tip of the first prong and the second side band contact is a tip contact located at the tip of the second prong. In some embodiments, the first side band contact is a tip contact located at the tip of the first prong and the second side band contact is a side wipe on the outer surface of the second prong. In some embodiments, the first side band contact is a tip contact located at the tip of the first prong and the second side band contact is a side wipe contact on the outer surface of the first prong. The busbar connector may include a plurality of side band contacts located in different longitudinal positions on the tip and/or side of the first prong and/or second prong.

In embodiments with a first side band contact and a second side band contact on a prong, the plurality of side band contacts may be located in different vertical positions. For example, a first side band contact may be a side wipe contact located on the outer surface of the first prong at a first vertical position, and a second side band contact may be a side wipe contact located on the outer surface of the first prong at a second vertical position. In some embodiments, the first side band contact may be a side wipe contact located on the outer surface of the first prong at a first vertical position, and a second side band contact may be a side wipe contact located on the outer surface of the first prong at a second vertical position and a second longitudinal position to allow the contact of different side band sources.

A side band source may be a continuous rail supported by the housing and/or insulator supports of the busbar. A continuous rail side band source may allow for a side band signal to be transmitted simultaneously to any electronic devices with a busbar connector in contact and/or communication with the continuous rail side band source. In some embodiments, a busbar has a plurality of parallel side band sources that are located at different positions, such as different longitudinal positions. A first side band contact of a busbar connector may contact only a first side band source at the first longitudinal position while a second side band contact of the busbar connector may contact a second side band source at a second longitudinal position. In some embodiments, a side band contact of the busbar connector contacts a plurality of side band sources of the busbar. In some embodiments, each side band contact of the busbar connector contacts only one of the side band sources of the busbar.

Different side band connections between busbar and the busbar connector may allow for the communication of different side band signals. For example, a conventional PDU in a rack system includes a plurality of signal pins that may be used to communicate different instructions to electronic devices. In some embodiments according to the present disclosure, the side band signals may include any of power capping instructions; electronic device enabling or disabling instructions; information, identification, or status requests; electronic device sleep mode instructions; or other communication signals between the rack manager (e.g., Power Shelf) and the electronic devices connected to the busbar.

In some embodiments, the side band source is a series of discrete contacts. The series of discrete contacts allows for positional information or device identification of the connected busbar connector (and associated electronic device). For example, when a plurality of electronic devices is connected to the busbar, the Power Shelf may identify an electronic device based on the side band source contact with which the busbar connector of the electronic device is in contact. The Power Shelf may, therefore, be able to send communication individually to different electronic devices through the series of side band sources, as opposed to a single signal provided to all connected devices through a continuous rail side band source.

A rack system includes, in some embodiments, a rack manager connected to the busbar, with one or more electronic devices (such as server blades) connected to the busbar. The rack manager may be in data communication with a row manager that provides instructions, such as power capping instructions, to the rack manager. In some embodiments, the rack manager transmits a power capping instruction to the side band source through a side band contact of the rack manager's busbar connector.

The side band signal provided to the side band source of the busbar is then received by any electronic devices connected to the side band source through the busbar connectors of the respective devices. In some embodiments, the side band source is a continuous rail connected to a plurality of busbar connectors. In some embodiments, the side band source includes a plurality of discrete contacts, and the rack manager provides the side band signal to the plurality of discrete contacts.

In some embodiments, the side band signal is provided on the side band source with an voltage of less than 48V. In some embodiments, the side band signal is provided on the side band source with an voltage of less than 12V. In some embodiments, the side band signal is provided on the side band source with an voltage of less than 5V.

In some embodiments, the side band signal is provided on the side band source with an electrical current of less than 10 milliamperes (mA). In some embodiments, the side band signal is provided on the side band source with an electrical current of less than 5 milliamperes (mA). In some embodiments, the side band signal is provided on the side band source with an electrical current of less than 3 milliamperes (mA).

A rack system according to the present disclosure may provide instructions to individual electronic devices connected to a DC busbar via side band signals. In some embodiments, a rack manager receives instruction from a row manager, and the rack manager communicates with a side band source of the busbar. The side band source of the busbar can transmit the instruction to the electronic devices connected to the busbar. In some embodiments, the rack manager sends instructions to electronic devices individually, such that at least one of the electronic devices does not receive the instructions. In some embodiments, the busbar has a plurality of side band contacts that allow individual communication with the electronic devices. In some embodiments, the side band source is a continuous rail that provide the side band signal to the plurality of electronic devices, and the side band signal includes instructions that communicate with individual electronic devices based on device identification.

In at least one embodiment, an electronic device provides a side band signal through the side band contact of the busbar connector to the side band source of the busbar. Through the side band source, the side band signal is transmitted to the rack manager, allowing two-way communication between the electronic device(s) and the rack manager.

The present disclosure relates to systems and methods for providing a connection for transmitting electrical power from a DC busbar according to at least the examples provided in the sections below:

Section 1. A busbar connector comprising:
an insulator body having a first prong and a second prong oriented in a longitudinal direction and proximate one another with a gap therebetween;
a positive power delivery contact on a first inner surface of the first prong adjacent the gap;
a negative power delivery contact on a second inner surface of the second prong adjacent the gap; and a side band contact positioned on the insulator body and insulated from the positive power delivery contact and negative power delivery contact by the insulator body.

Section 2. The electrical connector of section 1, wherein the side band contact is positioned on a tip of the first prong or second prong.

Section 3. The electrical connector of sections 1 or 2, wherein the side band contact is positioned on a first outer surface of the first prong opposite the first inner surface or on a second outer surface of the second prong opposite the second inner surface.

Section 4. The electrical connector of any preceding section, further comprising a side band return protruding in a direction perpendicular to the longitudinal direction.

Section 5. The electrical connector of any preceding section, wherein the side band contact is positioned on the first prong.

Section 6. The electrical connector of any preceding section, wherein the positive power delivery contact has a positive power delivery contact height in a vertical direction perpendicular to the longitudinal direction, and the side band contact has a side band contact height that is less than the positive power delivery contact height.

Section 7. The electrical connector of any preceding section, wherein the side band contact is insulated from the positive power delivery contact and negative power delivery contact by at least 1 millimeter of the insulator body.

Section 8. A system for providing electrical coupling, the system comprising:
a busbar connector including:
  an insulator body having a first prong and a second prong oriented in a longitudinal direction and proximate one another with a gap therebetween,
  a positive power delivery contact on a first inner surface of the first prong adjacent the gap,
  a negative power delivery contact on a second inner surface of the second prong adjacent the gap, and
  a side band contact positioned on the insulator body and insulated from the positive power delivery contact and negative power delivery contact by the insulator body; and
a busbar including:
  a positive rail oriented in a vertical direction perpendicular to the longitudinal direction,
  a negative rail oriented in the vertical direction and parallel to the positive voltage rail,
  an insulating material positioned between the positive rail and the negative rail, wherein the positive rail, negative rail, and insulating material defines a busbar thickness in a transverse direction perpendicular to the vertical direction and the longitudinal direction and the busbar thickness is approximately the same as the gap between the first prong and second prong, and
  a side band source oriented in a series parallel to the positive rail and having at least one source contact.

Section 9. The system of section 8, wherein the busbar is part of a server rack.

Section 10. The system of sections 8 or 9, wherein the side band source is located on an interior surface of the housing opposite the positive rail or the return rail in the transverse direction.

Section 11. The system of sections 8 or 9, wherein the side band source is located at a base of the busbar in the longitudinal direction relative to the positive rail.

Section 12. The system of any of sections 8-11, wherein the positive rail is electrically coupled to a DC power source.

Section 13. The system of any of sections 8-12, wherein the side band source is electrically coupled to a rack manager.

Section 14. The system of any of sections 8-10, wherein the positive power delivery contact is electrically coupled to a power supply of a server blade.

Section 15. A method for providing data communication in a computing device rack system, the method comprising:
at a rack manager:
  detecting a presence of a server blade via a side band contact electrically coupled to a side band source of a busbar of the computing device rack system,
  receiving instructions from a networked electronic device; and
  transmitting a side band signal to the server blade through the side band source.

Section 16. The method of section 15, wherein the side band signal is a power capping instruction.

Section 17. The method of sections 15 or 16, wherein the instructions are received from a row manager.

Section 18. The method of any of sections 15-17 further comprising providing DC electrical current to the server blade via the busbar.

Section 19. The method of section 18, wherein the DC electrical current is provided by the rack manager.

Section 20. The method of section 15, further comprising receiving electronic device information from the server blade via the side band source of the busbar.

Section 21. Any device, system, or method described or depicted herein.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A busbar connector comprising:
   an insulator body having a first prong and a second prong oriented in a longitudinal direction and proximate one another with a gap therebetween;
   a positive power delivery contact on a first inner surface of the first prong adjacent the gap;
   a negative power delivery contact on a second inner surface of the second prong adjacent the gap; and
   a side band contact positioned on the insulator body and insulated from the positive power delivery contact and the negative power delivery contact by the insulator body, the side band contact positioned on a first outer surface of the first prong opposite the first inner surface or on a second outer surface of the second prong opposite the second inner surface.

2. The busbar connector of claim 1, further comprising a side band return protruding in a direction perpendicular to the longitudinal direction.

3. The busbar connector of claim 1, wherein the side band contact is positioned on the first prong.

4. The busbar connector of claim 1, wherein the positive power delivery contact has a positive power delivery contact height in a vertical direction perpendicular to the longitudinal direction, and the side band contact has a side band contact height that is less than the positive power delivery contact height.

5. The busbar connector of claim 1, wherein the side band contact is insulated from the positive power delivery contact and the negative power delivery contact by at least 1 millimeter of the insulator body.

6. A system for providing electrical coupling, the system comprising:
   a busbar connector including:
      an insulator body having a first prong and a second prong oriented in a longitudinal direction and proximate one another with a gap therebetween,
      a positive power delivery contact on a first inner surface of the first prong adjacent the gap,
      a negative power delivery contact on a second inner surface of the second prong adjacent the gap, and
      a side band contact positioned on the insulator body and insulated from the positive power delivery contact and the negative power delivery contact by the insulator body; and
   a busbar including:
      a positive rail oriented in a vertical direction perpendicular to the longitudinal direction,
      a negative rail oriented in the vertical direction and parallel to the positive rail,
      an insulating material positioned between the positive rail and the negative rail, wherein the positive rail, negative rail, and insulating material defines a busbar thickness in a transverse direction perpendicular to the vertical direction and the longitudinal direction and the busbar thickness is approximately the same as the gap between the first prong and the second prong, and
      a side band source oriented parallel to the positive rail and having at least one source contact, the side band source located on an interior surface of a housing opposite the positive rail or the negative rail in the transverse direction.

7. The system of claim 6, wherein the busbar is part of a server rack.

8. The system of claim 6, wherein the side band source is located at a base of the busbar in the longitudinal direction relative to the positive rail.

9. The system of claim 6, wherein the positive rail is electrically coupled to a DC power source.

10. The system of claim 6, wherein the side band source is electrically coupled to a rack manager.

11. The system of claim 6, wherein the positive power delivery contact is electrically coupled to a power supply of a server blade.

12. A method for providing data communication in the system for providing electrical coupling of claim 6, the method comprising:
    at a rack manager:
       detecting a presence of a server blade via the side band contact electrically coupled to the side band source of the busbar of the system for providing electrical coupling of claim 6,
       receiving instructions from a networked electronic device, and
       transmitting a side band signal to the server blade through the side band source.

13. The method of claim 12, wherein the side band signal is a power capping instruction.

14. The method of claim 12, wherein the instructions are received from a row manager.

15. The method of claim 12 further comprising providing DC electrical current to the server blade via the busbar.

16. The method of claim 15, wherein the DC electrical current is provided by the rack manager.

17. The method of claim 12, further comprising receiving electronic device information from the server blade via the side band source of the busbar.

* * * * *